April 18, 1967

J. E. RACY 3,315,180

TRANSISTOR OSCILLATOR UTILIZING PLURAL CAVITIES
WITH PARTICULAR COUPLING THERETO

Filed Oct. 14, 1965

INVENTOR.
JOSEPH E. RACY

BY

ATTORNEY

United States Patent Office 3,315,180

Patented Apr. 18, 1967

3,315,180

TRANSISTOR OSCILLATOR UTILIZING PLURAL CAVITIES WITH PARTICULAR COUPLING THERETO

Joseph E. Racy, Nashua, N.H., assignor to Sanders Associates, Inc., Nashua, N.H., a corporation of Delaware Filed Oct. 14, 1965, Ser. No. 496,026
16 Claims. (Cl. 331—117)

This invention relates to a source of stable radio frequency signals. More particularly, it relates to a novel distributed parameter oscillator in which a resonant feedback element applies a stable feedback signal to the oscillator input terminals. The stability of the feedback signal frequency maintains the output frequency of the source essentially invariant in the face of changes in the characteristics of other oscillator circuit elements.

One prior stable source of high frequency signals employs a crystal oscillator driving a frequency multiplier. The frequency multiplier often has multiple stages in order to develop an output signal having the desired high frequency.

Such sources are relatively complex and generally lack a high degree of mechanical stability and ruggedness. As a result, they have relatively poor reliability when subjected to adverse environmental conditions. Moreover, they are relatively inefficient in terms of the output power developed with a given amount of input power.

Also, over large temperature ranges, many crystal oscillators exhibit frequency deviations that are difficult to correct. Another drawback is that the signal driving the crystal is required to be within a narrow amplitude range to maintain the crystal in operation and yet not overdrive the crystal and thereby damage it.

Further, problems have heretofore been encountered in matching a semiconductor valving device such as a transistor to a frequency-controlling resonant circuit while at the same time isolating the resonant frequency of the circuits from changes in the impedance characteristics of the valving device and the load connected thereto.

Accordingly, it is an object of the present invention to provide an improved stable high frequency source.

Another object of the invention is to provide a source having the stability normally attributed to crystal oscillators and which operates at frequencies higher than crystal resonances without the use of frequency multipliers.

A further object of the invention is to provide a stable high frequency source that is readily temperature compensated over a wide range of ambient temperatures.

It is also an object of the invention to provide a high frequency oscillator characterized by frequency stability over a wide range of feedback signal levels.

A further object of the invention is to provide a source of the above character that is mechanically rugged and electrically reliable.

Another object of the invention is to provide a source having the above features and characterized by relatively high electrical efficiency.

Other objects of the invention will in part be obvious and will in part appear hereinafter.

The invention accordingly comprises the features of construction, combinations of elements, and arrangements of parts which will be exemplified in the construction hereinafter set forth, and the scope of the invention will be indicated in the claims.

For a fuller understanding of the nature and objects of the invention, reference should be had to the following detailed description taken in connection with the accompanying drawings, in which.

In general, the source is a feedback oscillator having a resonant output circuit to which the load is coupled. A high-Q resonant feedback element is energized with a signal tapped from the output circuit. A low impedance probe couples the resultant electrical oscillations in the feedback element to the oscillator input terminals with the proper phase to sustain oscillations at the resonant frequency of the feedback element.

The source thus oscillates at the resonant frequency of the feedback element. However, the resonant frequency of the feedback element is effectively isolated from the load, as well as from the output circuit and from the input and output characteristics of the source valving device, which can be a vacuum tube or a transistor. The frequency of the source is thus essentially independent of changes in the electrical characteristics of these elements.

When the source is required to operate over an unusually wide range of temperatures, a compensating element can readily be incorporated in the feedback element to cancel temperature-dependent variations in its resonant frequency.

As a result of these and other features to be described below in greater detail, the present invention provides a radio frequency source of high stability and reliability for operation over a wide temperature range. The source is readily capable of producing oscillations in the gigacycle range (above $10^9$ cycles per second) without the use of frequency multiplying stages. A further characteristic of the source is that its stability increases with the gain of the valving device.

Further, since the source does not require a crystal, it is free from the prior art crystal oscillator requirement that the level of the feedback signal be restricted for oscillation without crystal damage.

Figure 1:
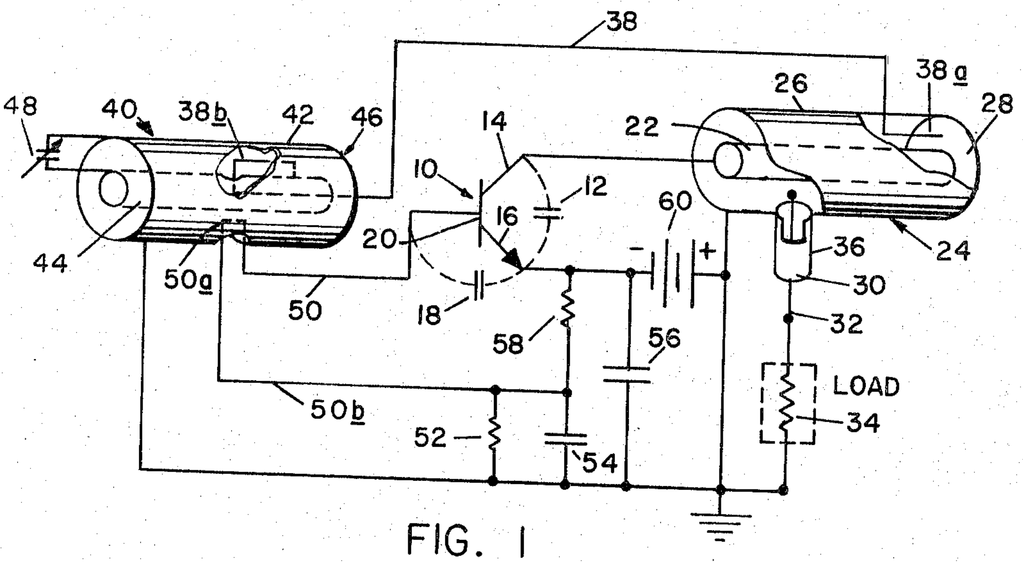
FIGURE 1 is a schematic representation of a source embodying the invention.

In the illustrated embodiment of the invention now to be described, both the resonant output circuit and the resonant feedback element are quarter-wavelength coaxial transmission line cavities and the valving device is a transistor. More particularly, as shown in FIGURE 1, the source has a transistor 10 whose internal reactances include a capacitance 12 appearing between the collector 14 and the emitter 16 and a capacitance 18 appearing between the emitter and the base 20. The collector 14 is connected to the end of an inner conductor 22 of a resonant coaxial transmission line output cavity 24 having an outer conductor 26. A conductive wall 28 interconnects the coaxial conductors 22 and 26 at the opposite end of the cavity.

An output probe 30 has an inner conductor 32 coupled with the energy in the output cavity 24 for applying the source output signal to an electrical load 34. The probe 30 also includes a coaxial outer conductor 36 connected to the cavity outer conductor 26.

As also shown in FIGURE 1, a feedback conductor 38 couples a small portion of the energy in the output cavity 24 to a feedback cavity 40. In particular, in the output cavity 24 the illustrated conductor 38 connects to the end wall 28 to form an inductive loop **38*a***.

The feedback cavity 40 has a hollow cylindrical outer conductor 42 coaxial with an inner conductor 44 to which the conductor 38 is connected. A conductive end wall 46 extends radially between the outer conductor 42 and the inner conductor 44 at one end of the feedback cavity, which is resonant at the desired frequency of operation. The outer conductor 42 of the feedback cavity and the outer conductor 26 of the output cavity 24 are both connected to ground.

Where desired, a temperature-sensitive capacitor 48 is coupled between the feedback cavity outer and inner conductors. The capacitance of the capacitor changes with temperature so as to compensate for dimensional changes of the cavity conductors as the ambient temperature changes. As a result, the resonant frequency of the feedback cavity 40, which is preferably constructed with conductive materials having small thermal coefficients of expansion, is essentially invariant over a wide temperature range.

The transistor 10 is coupled to the feedback cavity 40 by means of a loop conductor 50 connected to the transistor base 20. More particularly, the loop conductor 50 passes through the feedback cavity outer conductor 42, forms a loop 50*a* within the cavity, and then passes out through the outer conductor again. It does not contact the feedback cavity conductors and can hence be at a direct voltage different from the direct voltages of the cavity conductors. A radio frequency bypass capacitor 54, in parallel with a resistor 52, couples the end 50*b* of the loop conductor to ground at the frequency of operation.

The transistor emitter 16 is maintained at radio frequency ground by means of a bypass capacitor 56 connected between the emitter and ground. A direct current source 60, shown as a battery, is connected between the emitter 16 and ground to provide the transistor operating and bias voltages. A resistor 58 connected between the emitter and the loop conductor end 50*b* forms a voltage divider with the resistor 52 to maintain the proper base-emitter bias.

With this arrangement, the transistor 10 operates as an amplifier whose input terminals are the base 20 and ground and whose output terminals are the collector 14 and ground. The output cavity 24 is in parallel with the internal capacitance 12 between the collector 14 and the emitter 16. At the amplifier input terminals, the loop conductor 50 is in parallel with the transistor internal capacitance 18.

At the frequency of operation, the output cavity 24 has an inductive reactance that resonates with the transistor internal capacitance 12. The transistor 10 thus has a parallel resonant load circuit 12–24. Such a resonant circuit has a high resonant impedance.

The high-Q feedback cavity 40 is tuned to be resonant at the desired frequency of operation. The feedback cavity then couples energy to the loop 50*a* only at the desired frequency. This operation of the feedback cavity is analogous to that of a narrow bandpass filter whose passband is at the operating frequency. Also, at this frequency, the electrical delay of the feedback conductor 38 plus that of the feedback cavity 40 are such that energy coupled to the loop 50*a* has the correct phase to cause the transistor 10 to regenerate the energy fed back from the output cavity 24.

Considering the feedback portion of the source in greater detail, the feedback conductor 38 is relatively loosely coupled, i.e. with a small coupling ratio, to both the output cavity 24 and the feedback cavity 40. The feedback cavity is thereby substantially isolated from changes in the impedance of output cavity 24. This impedance is in part determined by the cavity itself and in part by the load 34 and by the output impedance of transistor 10, including the internal capacitance 12. Due to this isolation of the feedback cavity, the frequency of oscillation is essentially unaffected by changes in the output cavity 24, as well as by changes in the impedances that the transistor and the load present to the output cavity.

Further, the loop conductor 50, coupled by the by-pass capacitors 54 and 56 between the transistor base and emitter, is relatively loosely coupled to the feedback cavity 40. Accordingly, the feedback cavity is substantially isolated from changes in the transistor input characteristics.

As a result of these features, the frequency of the source is essentially exclusively determined by the feedback cavity 40, which is essentially unaffected by such external effects as temperature changes, aging of other components, load variations or fluctuations in the supply 60. Moreover, the source is relatively efficient in that its output power is a considerable portion of the operating power drawn from the supply 60.

With further reference to FIGURE 1, the transistor 10 preferably has a high gain so that it can sustain oscillations in the output cavity 24 with a relatively weak input signal from the cavity 40. This is desirable because as the transistor gain increases, the source can operate with less coupling between the output cavity 24 and the feedback cavity 40, and between the loop 50*a* and the cavity 40. This decrease in the coupling to the cavity 40 increases the degree of isolation of the cavity resonant frequency from changes in the remainder of the circuit, thereby further stabilizing the frequency of oscillation.

It should also be noted that the circuit arrangement of FIGURE 1 provides electrically efficient impedance matching between the transistor 10 and the cavities 24 and 40. More particularly, the end of the cavity 24 to which the transistor 10 is connected is at a high impedance. Thus, the cavity 24 is matched to the high transistor output impedance for efficient power transfer from the transistor. At the transistor input, the loop conductor 50 has a low output impedance, matching the low transistor input impedance.

Figure 2:
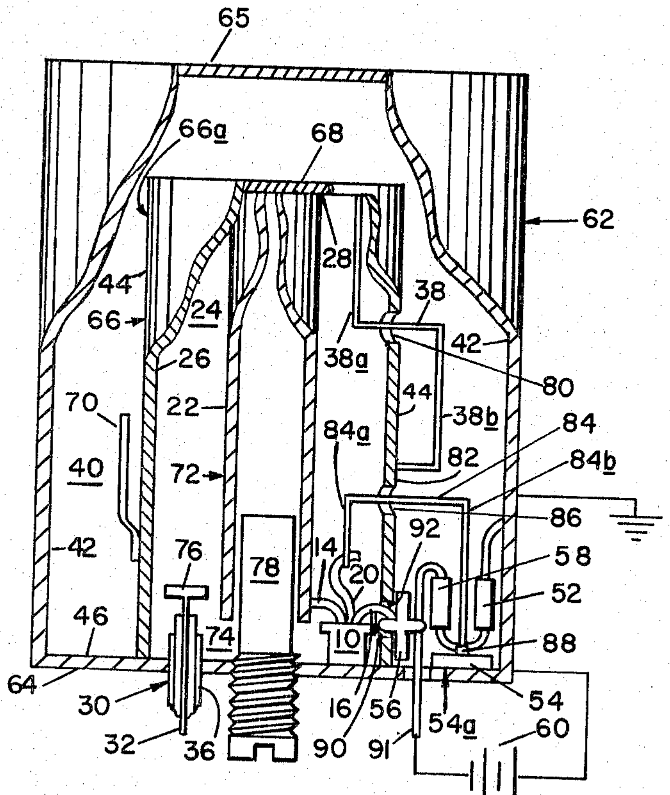
FIGURE 2 is a side elevation view, partly broken away, of the source of FIGURE 1 constructed in accordance with the invention.

The circuit of FIGURE 1 is embodied in the construction illustrated in FIGURE 2. In this construction the feedback transmission line cavity and the output transmission line cavity are arranged coaxial with each other in a triaxial construction.

More specifically, a cylindrical conductive shell 62 closed at each end with conductive end plates 64 and 65 forms the housing for the source. The inner surface of the shell 62 is the outer conductor 42 of the FIGURE 1 feedback cavity 40, and the lower end plate forms the cavity end wall 46. A tubular conductive member 66 is secured to the plate 64 coaxially within the outer conductor 42. The outer surface of the member 66 is the inner conductor 44 of feedback cavity 40. A flat conductive plate 68 closes the end of the member 66 at its end 66*a* remote from the end plate 64.

The tubular member 66 extends for substantially a quarter wavelength at the desired frequency of source operation from the end plate 64 so that the low radio frequency impedance at the end plate 64 is transformed to a relatively high impedance between the conductors 42 and 44 at the end 66*a*.

As also shown in the feedback cavity 40, the temperature compensating capacitor 48 of FIGURE 1 takes the form of a bi-metallic strip 70 secured in a cantilever fashion to the inner conductor 44, with the free end moving toward and away from the outer conductor 42, to respectively increase and decrease the capacitance between the two conductors, as the temperature fluctuates. Other forms of temperature-dependent capacitors, including a varactor connected between the shell 62 and the tubular member 66, can also be used to provide temperature compensation of the feedback cavity resonant frequency.

With further reference to FIGURE 2, the outer conductor 26 of the output cavity 24 is the inner surface of the tubular member 66. The inner conductor 22 is formed by the outer surface of a tube 72 connected to the end plate 68. The tube extends coaxially with the tubular member 66 and the shell 62 toward the end plate 64, from which it is spaced by an axial gap 74. The end plate 68, whose inner surface forms the end wall 28 of the output cavity 24, presents a low radio frequency impedance between the output cavity conductors 22 and 26.

At the other end of the output cavity, i.e. adjacent the gap 74 substantially a quarter wavelength from the end wall 28 at the frequency of source operation, there is a relatively high radio frequency impedance between the conductors 22 and 26. Adjacent this point the capacitive probe 30 is disposed between the conductors 22 and 26 to transfer output energy to external circuits, such as the load 34 of FIGURE 1. The probe outer conductor 36 is grounded by connecting it to the shell end plate 64 and an annular disk 76 is provided on the inner end of the probe inner conductor 32 to increase the capacitive coupling of the probe to the oscillating electrical fields in the output cavity 24.

As also shown in FIGURE 2, an electrically conductive tuning screw 78 threadedly engages the end plate 64 to form an electrical connection therewith and axially extends into the hollow interior of the tube 72. Turning of the tuning screw 78 changes its length in the tube 72 and thereby alters the capacitance between the output cavity inner conductor 22 and outer conductor 26 to adjust the resonant frequency of the cavity 24.

In the output cavity 24, the feedback conductor 38 connects to the end wall 28 formed by the plate 68 and axially extends between the conductors 22 and 26 for a short distance. The conductor then radially extends through a hole 80 in the tubular member 66 and enters the feedback cavity 40. The portion of the conductor 38 in the output cavity 24 forms the FIGURE 1 loop 38*a*.

In the feedback cavity 40, the feedback conductor 38 axially extends between inner and outer conductors, 44 and 42 respectively toward the low impedance end of the cavity adjacent the end plate 64. It then joins to the inner conductor 44 at a connection 82. This portion of the feedback conductor 38 within the feedback cavity 40 forms an inductive loop 38*b*.

The transistor 10 is mounted on the inner surface of the shell end plate 64 in the coaxial space of the output cavity 24. The collector 14 is connected directly to the tube 72 adjacent its end forming the gap 74, i.e. at the high impedance end of the output cavity. A conductor 84 having a portion 84*a* in the output cavity 24 and a portion 84*b* in the feedback cavity 40, passes through a hole 86 in the tubular member 66 and interconnects the transistor base 20 with a terminal 88 of the capacitor 54. The other terminal of the capacitor 54 is on the annular face 54*a* that is secured to the shell end plate 64, as by soldering. The resistor 52 is arranged in parallel with the capacitor 54 by connecting it between the capacitor terminal 88 and the housing shell 62, which is at ground potential.

The transistor emitter 16 is connected to the bypass capacitor 56 by means of a feed-through terminal 90 protruding through the tubular member 66 in a hole 92. The terminal 90 also protrudes from the other side of the capacitor 56 where it is connected by a conductor 91 passing through the end plate 64 to the negative terminal of the supply 60. The positive terminal of the supply 60 is connected to the grounded shell 62. The other terminal of the capacitor 56 is in the form of a ring on the capacitor face secured to the cylindrical member 66 along the periphery of the hole 92; this arrangement connects the capacitor to the end of the tubular member 66 adjacent the shell end plate 64 and hence to ground. The resistor 58 is between the feed-through terminal 90 and the terminal 88 on the capacitor 54.

The above triaxial arrangement provides a highly compact and electrically efficient construction for the source. Moreover, it is mechanically rugged.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described the invention, what is claimed as new and secured by Letters Patent is:

1. In an electrical oscillator having a distributed parameter resonant output circuit and an electrical valving device connected to produce electrical signals in the output circuit in response to an input signal applied to first and second input terminals of the valving device, the combination comprising
   (A) a second distributed parameter resonant circuit
   (B) a probe conductor
      (1) coupled with said second resonant circuit and connected to said input terminals of said valving device, and
      (2) free from a substantially non-resistant direct current connection to said second resonant circuit, and
   (C) feedback coupling means energizing said second resonant circuit with electrical energy from said resonant output circuit, said second resonant circuit and said feedback coupling means and said probe conductor producing a signal at the input to said valving device with such relative phase that the resultant output signal from said valving device reinforces oscillations in said resonant output circuit.

2. An oscillator according to claim 1 in which said probe conductor comprises a loop portion intermediate first and second ends, said first end being connected to said first terminal, said loop being coupled with said second resonant circuit, and said second end being capacitively coupled to said second terminal.

3. An oscillator comprising in combination
   (A) an electrical valving device arranged in an amplifier circuit having a pair of input terminals and a pair of output terminals,
   (B) an output cavity,
   (C) circuit means connected with said output cavity and forming a first resonant circuit therewith, said first resonant circuit being connected between said amplifier output terminals and having a high resonant impedance,
   (D) a feedback cavity resonant at the frequency at which said first circuit is resonant,
   (E) probe means coupled to said feedback cavity and in circuit with said amplifier input terminals, and
   (F) feedback conductor means in circuit between said output cavity and said feedback cavity,
   (G) said feedback cavity being relatively isolated from the impedance appearing at said output cavity and from the impedance appearing at said probe.

4. An oscillator according to claim 3 in which said probe means presents a relatively low impedance to said input terminals at said frequency.

5. An electrical oscillator comprising in combination
   (A) an electronic valving device
      (1) having first, second and third elements,
      (2) and responding to an input signal applied between said first and third elements to produce an amplified signal between said first and second elements,
   (B) means forming a first capacitance between said first and second elements,
   (C) means forming a second capacitance between said first and third elements,
   (D) a first cavity
      (1) coupled between said first and second elements, and
      (2) resonating with said first capacitance at a first frequency.
   (E) a second cavity resonant at said first frequency,
   (F) a conductor
      (1) in circuit between said first and third elements,
      (2) coupled with said second resonant cavity and responding to energy in said second cavity to develop a voltage between said first and third elements, (3) the impedance of said conductor between said elements being essentially independent of said second cavity at said first frequency, and (G) feedback means coupling energy from said first cavity to said second cavity.

6. An oscillator according to claim 5 in which said first and second capacitances are internal capacitances of said valving device.

7. An oscillator according to claim 6 in which said valving device is a transistor whose emitter is said first element, whose collector is said second element and whose base is said third element.

8. An oscillator according to claim 7 further comprising an output probe in said first cavity for applying the output signal from said oscillator to a load.

9. A radio frequency source comprising in combination (A) triaxial tubular conductive means (1) forming a first resonant coaxial transmission line cavity having a first inner conductor and a first outer conductor.

(2) forming a second resonant coaxial transmission line cavity having a second inner conductor and a second outer conductor, (3) said first conductors being coaxially within said second inner conductor, (B) feedback coupling means applying radio frequency energy from said first cavity to said second cavity, (C) an electronic valving device (1) having first, second and third elements and responding to an input signal applied between said first and third terminals to produce between said first and second elements an amplified signal corresponding to said input signal, (2) having said first and second elements coupled to said first cavity to produce said amplified signal between said first conductors, and (D) conductor means (1) in circuit between said first and third elements, (2) presenting a relatively low radio frequency impedance between said first and third elements, and (3) protruding into said second cavity and coupled with the space between said second conductors.

10. A source according to claim 9 in which (A) said cavities are substantially resonant at a first frequency, (B) said triaxial conductive means has first and second axially spaced ends, (C) at said first frequency and in the vicinity of said first end (1) said first cavity has a relatively high impedance, and (2) said second cavity has a relatively low impedance, (D) at said first frequency said first cavity has a relatively low impedance at a location spaced from said high impedance, (E) said feedback coupling means couples energy from said first cavity in the vicinity of said low impedance, and (F) said valving device is coupled to said first cavity in the vicinity of said first end.

11. A source according to claim 9 in which said conductor means comprises a conductor (A) having first and second ends and connected at its first end to said third element, (B) capacitively coupled at its second end to a location on said triaxial conductive means that is at radio frequency ground potential, (C) free of substantially non-resistant electrical contact with said second inner conductor, and (D) having a portion intermediate said ends, said portion being disposed between said second conductors.

12. A source according to claim 9 in which said conductor means is free of direct current electrical contact with said second conductors.

13. An electrical source comprising in combination (A) a conductive inner member having a tubular outer first surface, (B) a conductive outer member having a tubular inner second surface coaxial with said outer first surface, (C) a conductive intermediate member (1) having a tubular outer third surface and a tubular inner fourth surface, (2) disposed coaxial with and intermediate said inner and outer members, thereby forming (a) a first inner transmission line whose inner conductor is said first surface and whose outer conductor is said fourth surface, and (b) a second outer transmission line whose inner conductor is said third surface and whose outer conductor is said second surface, (D) a first conductive plate connected between said intermediate member and said outer member to form a low radio frequency impedance at a first end of said second transmission line, (E) a second conductive plate connected between said outer member and said inner member at the end of said outer member remote from said first plate to form a low radio frequency impedance at a second end of said first transmission line, (F) a feedback conductor passing through said intermediate member and coupling electrical energy energy from said first transmission line to said second transmission line, (G) an electronic valving device having first, second and third elements and producing between said first and second elements an amplified signal corresponding to an input signal applied between said first and third elements, (1) said second element being connected to said inner member adjacent its end remote from said second end of said first transmission line, (2) said first element being capacitively coupled to said outer conductor of said first transmission line, (3) said third element being coupled to said second transmission line.

14. A source according to claim 13 further comprising means forming a temperature dependent capacitor coupled in said second transmission line between said outer member and said intermediate member.

15. A source according to claim 13 in which said electronic valving device is a transistor whose collector is said second element, whose emitter is said first element and whose base is said third element.

16. A radio frequency source comprising in combination (A) a closed conductive housing having (1) a cylindrical shell having first and second axially-spaced ends, (2) first and second end plates closing said shell at said first and second ends respectively, (B) a conductive cylindrical tube having third and fourth ends and being secured at said third end to said first end plate coaxially within said shell, (C) a third end plate (1) closing said tube at said fourth end, (2) said third plate being axially spaced from said second end plate so that at a first frequency a first coaxial transmission line formed by said shell and said tube has a relatively high radio frequency impedance in the region adjacent to said fourth end of said tube, (D) a conductive rod
(1) having fifth and sixth ends,
(2) secured at said sixth end to said third end plate coaxially within said tube, and
(3) said fifth end being spaced from said first end plate so that in the vicinity of said first frequency a second coaxial transmission line formed by said tube and said rod has a relatively high radio frequency impedance in the region adjacent said fifth end of said rod,
(E) output probe means extending through said housing and coupled with said second coaxial line,
(F) a transistor having its collector connected to said rod,
(G) a first capacitor between the emitter of said transistor and said housing,
(H) a second capacitor having one terminal connected to be at the potential of said housing, (I) first conductor means coupled with said first transmission line and in series between the base of said transistor and the other terminal of said second capacitor, and
(J) a feedback conductor
(1) passing through said tube,
(2) having a first portion coupled with said first transmission line, and
(3) having a second portion coupled with said second transmission line.

No references cited.

ROY LAKE, *Primary Examiner.*
J. KOMINSKI, *Assistant Examiner.*

UNITED STATES PATENT OFFICE
CERTIFICATE OF CORRECTION

Patent No. 3,315,180 April 18, 1967

Joseph E. Racy

It is certified that error appears in the above identified patent and that said Letters Patent are hereby corrected as shown below:

Column 8, line 29, "outer member" should read -- intermediate member --.

Signed and sealed this 12th day of August 1969.

(SEAL)
Attest:

Edward M. Fletcher, Jr.
Attesting Officer

WILLIAM E. SCHUYLER, JR.
Commissioner of Patents